US011510334B2

(12) United States Patent
Tang et al.

(10) Patent No.: US 11,510,334 B2
(45) Date of Patent: Nov. 22, 2022

(54) SLIDING RAIL STRUCTURE AND SERVER CABINET

(71) Applicant: Fulian Precision Electronics (Tianjin) Co., LTD., Tianjin (CN)

(72) Inventors: Chen-Sheng Tang, New Taipei (TW); Chang-Ju Wu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 274 days.

(21) Appl. No.: 16/862,218

(22) Filed: Apr. 29, 2020

(65) Prior Publication Data

US 2021/0329807 A1  Oct. 21, 2021

(30) Foreign Application Priority Data

Apr. 17, 2020  (CN) .......................... 202010306979.0

(51) Int. Cl.
| | |
|---|---|
| *H05K 7/14* | (2006.01) |
| *H05K 7/18* | (2006.01) |
| *A47B 96/06* | (2006.01) |
| *A47B 88/43* | (2017.01) |

(52) U.S. Cl.
CPC .......... *H05K 7/1489* (2013.01); *A47B 88/43* (2017.01); *A47B 96/068* (2013.01); *H05K 7/14* (2013.01); *H05K 7/183* (2013.01)

(58) Field of Classification Search
CPC ........ H05K 7/1489; H05K 7/183; H05K 7/14; A47B 88/044; A47B 88/00; A47B 88/0418; A47B 88/042; A47B 7/00; A47B 96/068; A47B 96/07; A47B 88/43; A47B 88/44

See application file for complete search history.

(56) References Cited

U.S. PATENT DOCUMENTS

| | | | | |
|---|---|---|---|---|
| 8,602,225 | B2 * | 12/2013 | Lin .......................... | A47B 88/43 312/334.4 |
| 8,727,138 | B2 * | 5/2014 | Dittus ..................... | H05K 7/183 312/334.4 |
| 9,066,591 | B2 * | 6/2015 | Chen ..................... | H05K 7/1489 |
| 9,125,489 | B2 * | 9/2015 | Chen ..................... | A47B 88/43 |
| 9,140,299 | B2 * | 9/2015 | Fan .......................... | F16C 43/02 |

(Continued)

FOREIGN PATENT DOCUMENTS

| | | |
|---|---|---|
| CN | 102791104 A | 11/2012 |
| CN | 102973018 A | 3/2013 |

(Continued)

*Primary Examiner* — Nkeisha Smith
(74) *Attorney, Agent, or Firm* — ScienBiziP, P.C.

(57) ABSTRACT

A server cabinet which can be assembled and disassembled by means of a buckle instead of screws includes a fixing plate and a sliding rail structure. The fixing plate defines restriction holes. The sliding rail structure comprises a rail assembly and a buckle. The rail assembly includes first and second limiting portions. The second limiting portion passes through the restriction hole and is disposed on a first side of the fixing plate. The first limiting portion, with a first limiting hole, is disposed on a second side of the fixing plate opposite to the first side. The second limiting portion, with a second limiting hole, communicates with the first limiting hole. The buckle is hooked and passes through the first limiting hole to abut the first side, and can be disengaged from the first side by rotation.

19 Claims, 10 Drawing Sheets

(56) References Cited

U.S. PATENT DOCUMENTS

| | | | | |
|---|---|---|---|---|
| 9,375,087 B1* | 6/2016 | Chen | ................ | H05K 7/1489 |
| 9,844,162 B2* | 12/2017 | Tang | ................ | H05K 7/1489 |
| 10,743,657 B2* | 8/2020 | Chen | ................ | H05K 7/1489 |
| 10,925,398 B2* | 2/2021 | Chen | ................ | A47B 88/43 |
| 2005/0189855 A1* | 9/2005 | Naue | ................ | A47B 88/43 |
| | | | | 312/334.4 |
| 2012/0018605 A1* | 1/2012 | Lacarra | ................ | A47B 88/43 |
| | | | | 211/163 |

FOREIGN PATENT DOCUMENTS

| | | |
|---|---|---|
| TW | M528575 | 9/2016 |
| TW | I608780 | 12/2017 |

* cited by examiner

SLIDING RAIL STRUCTURE AND SERVER CABINET

FIELD

The subject matter herein generally relates to structure of server cabinets, especially to a sliding rail structure for a server cabinet.

BACKGROUND

A server cabinet can include a number of pairs of pillars and a number of pairs of sliding rails positioned between the pillars. A fixing plate is fixed to the sliding rail and positioned between each sliding rail and the pillar. The fixing plate and the pillar define screw holes. Screws are positioned in the screw holes to fix the sliding rail and the pillar together. Thus, when assembling or disassembling the pillar, a tool may be needed.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
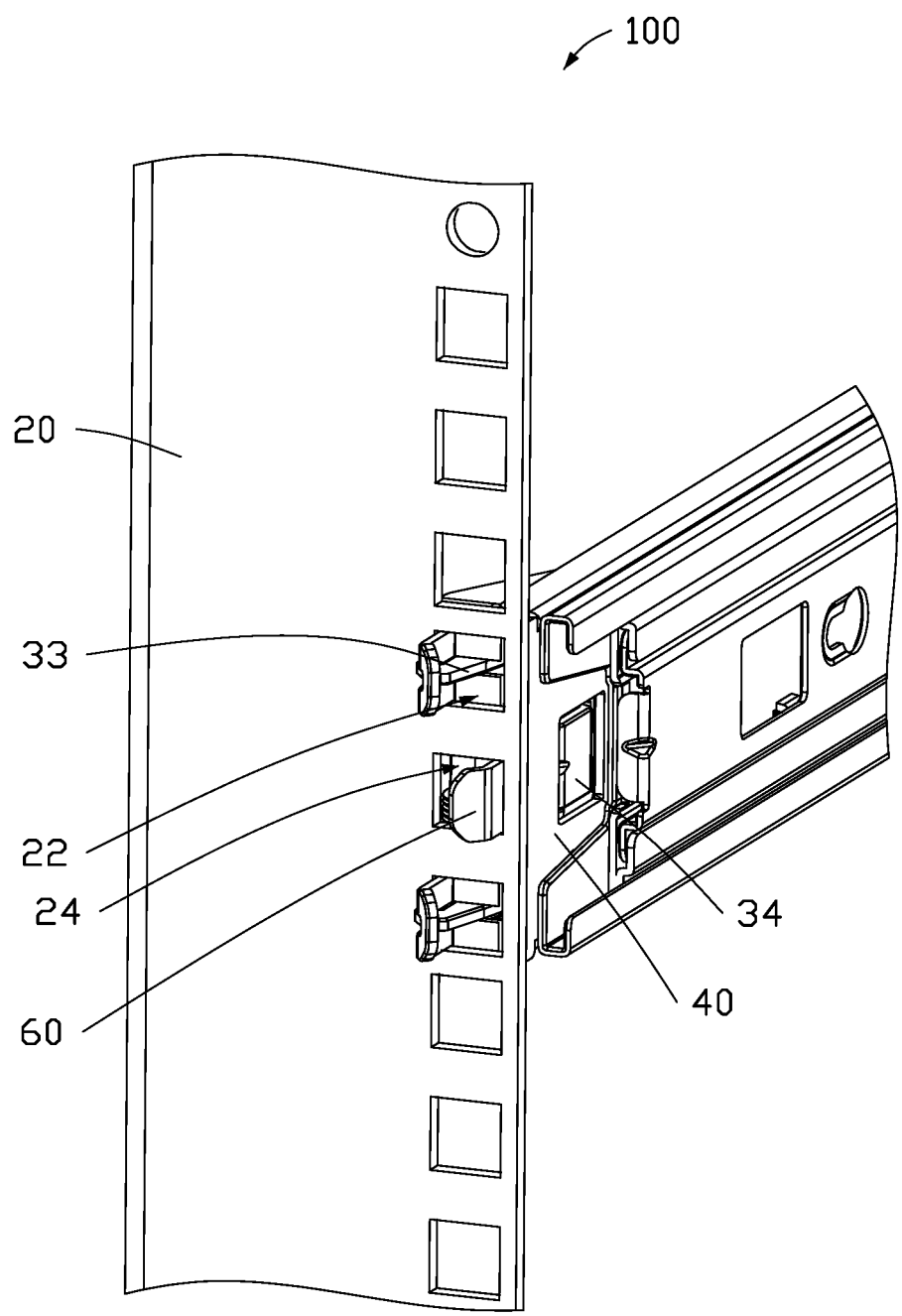
FIG. 1 is an isometric view of a server cabinet according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
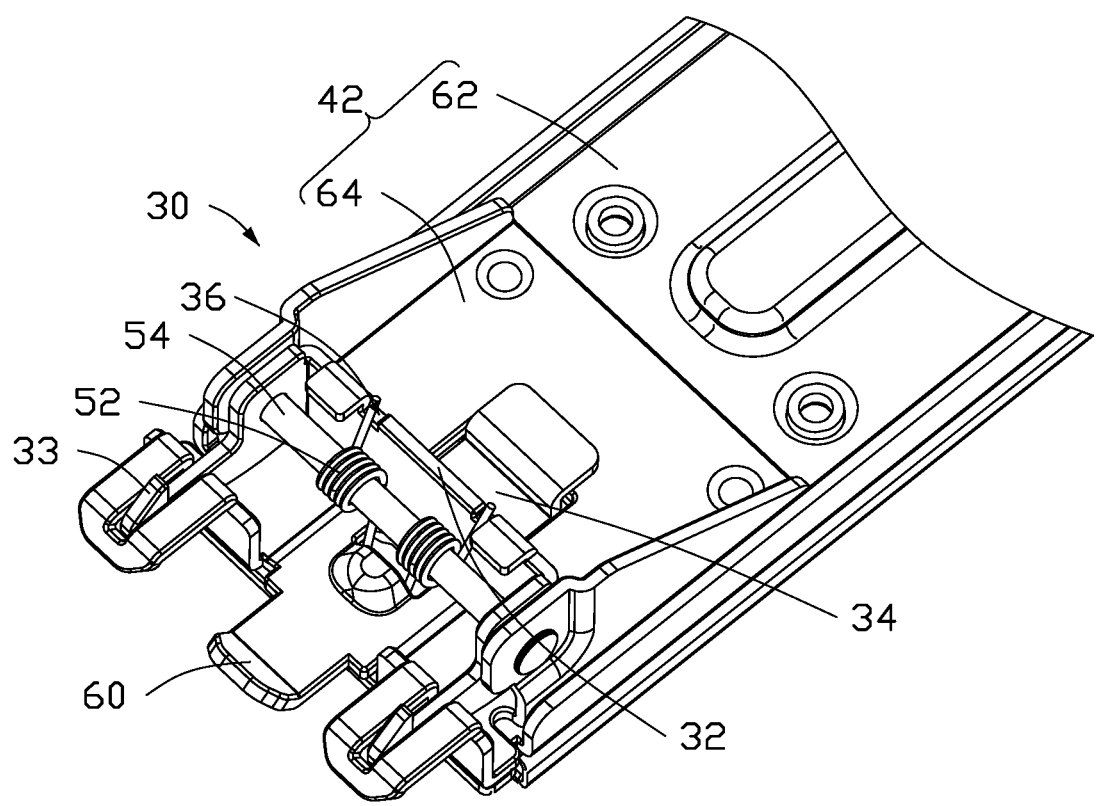
FIG. 2 is an isometric view of a sliding rail structure of the server cabinet of FIG. 1.

FIGS. 1 and 2 illustrate a server cabinet 100 according to an embodiment of the present application. The server cabinet 100 is configured to receive servers (not shown). The server cabinet 100 includes at least one pair of opposite fixing plates 20 and at least one pair of sliding rail structures 30 connected between the opposite fixing plates 20. The server is positioned between the sliding rail structures 30. In this application, one sliding rail structure 30 and one fixing plate 20 are described in explaining the server cabinet 100.

Figure 3:
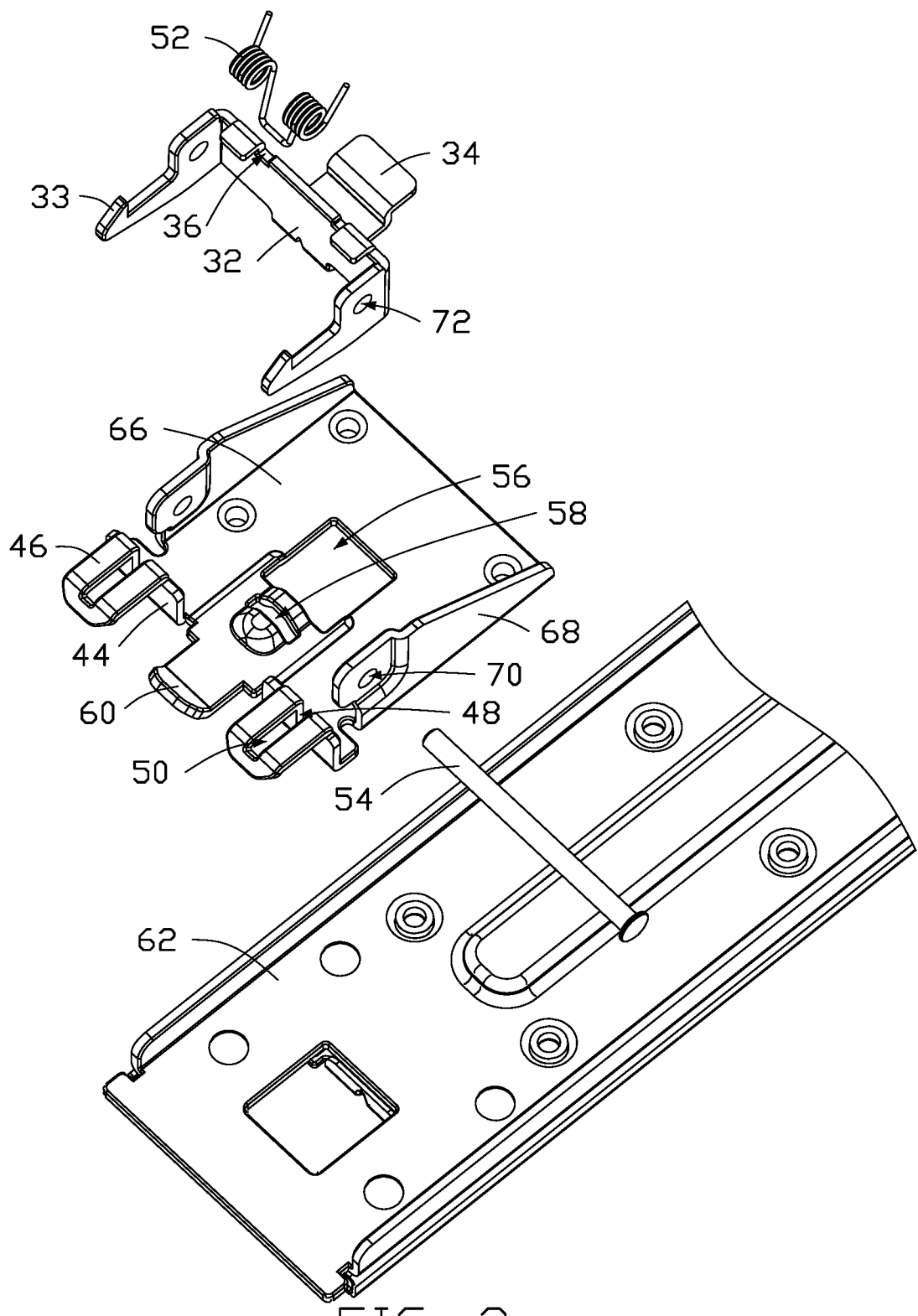
FIG. 3 is an exploded isometric view of the sliding rail structure of FIG. 2.

Referring to FIGS. 2 and 3, the fixing plate 20 defines a plurality of restriction holes 22. The restriction holes 22 may be square, round, or the like. The sliding rail structure 30 includes a rail assembly 40 and a buckle 32 rotatably connected to the rail assembly 40. The rail assembly 40 includes a rail member 42. The rail member 42 includes at least one first limiting portion 44 and at least one second limiting portion 46. Each of the at least one first limiting portion 44 defines a first limiting hole 48, and each of the at least one second limiting portion 46 defines a second limiting hole 50 communicating with the corresponding first limiting hole 48. The second limiting portion 46 passes through the restriction hole 22 and is disposed on a first side of the fixing plate 20. The first limiting portion 44 is disposed on a second side of the fixing plate 20 opposite to the first side. The buckle 32 includes at least one hook 33. The hook 33 passes through the first limiting hole 48 to abut the first side. When the buckle 32 is rotated through a preset angle, the hook 33 disengages from the first side so that the fixing plate 20 is detachable axially along the restriction hole 22.

In an embodiment of the present application, a size of the second limiting portion 46 in a first direction is consistent with a size of the restriction hole 22 in the first direction. A size of the second limiting hole 50 in the first direction is consistent with a size of the hook 33 in the first direction. The first direction is perpendicular to a rotation plane of the hook 33. In this way, the rail assembly 40 is prevented from moving in the restriction hole 22, and the hook 33 is prevented from moving in the second limiting hole 50.

The rail assembly 40 further includes an elastic member 52 and a rotating shaft 54. The rotating shaft 54 is fixed to the rail member 42. The elastic member 52 is sleeved on the rotating shaft 54 and resists the rail member 42 and the buckle 32. The rail member 42 defines a through hole 56. The buckle 32 includes a pressing portion 34. One end of the pressing portion 34 abuts a side of the rail member 42 adjacent to the hook 33. Part of the pressing portion 34 is positioned in the through hole 56 so that an operator can press the pressing portion 34 to rotate the buckle 32 around the rotating shaft 54. The rail member 42 further defines an accommodating groove 58. Part of the elastic member 52 is positioned in the accommodating groove 58 and resists the rail member 42. The buckle 32 defines two locking slots 36. The ends of the elastic member 52 are in the two locking slots 36 and resist the buckle 32. The elastic member 52 may be a torsion spring, a tension spring, an elastic sheet, or the like.

In an embodiment, the rail member 42 includes two first limiting portions 44 and two second limiting portions 46. The buckle 32 includes two hooks 33. The first limiting hole 48 is perpendicular to the second limiting hole 50. The rail member 42 further includes a third limiting portion 60 disposed between the two second limiting portions 46. The fixing plate 20 also defines a first positioning hole 24. The third limiting portion 60 is connected to the fixing plate 20 through the first positioning hole 24 to further restrict the movement of the rail member 42 relative to the fixing plate 20.

Referring to FIG. 3, in one embodiment, the rail member 42 includes a sliding rail 62 and a connecting member 64 (shown in FIG. 2) fixed to an end of the sliding rail 62. The connecting member 64 can be an extension of the sliding rail 62. The connecting member 64 includes a base plate 66 parallel to an extending direction of the sliding rail 62 and two spaced fixing pieces 68 protruding onto the base plate 66. The through hole 56 and the accommodating groove 58 are defined on the base plate 66. The first limiting portion 44, the second limiting portion 46, and the third limiting portion 60 are disposed between ends of the two fixing pieces 68. Two first receiving holes 70 are formed on the two fixing pieces 68. The buckle 32 defines two second receiving holes 72. The buckle 32 is disposed between the two fixing pieces 68. The rotating shaft 54 passes through the two first receiving holes 70 and the two second receiving holes 72 and is connected to the buckle 32 and the connecting member 64. The third limiting portion 60 is in shape of a sheet, an extending direction of the third limiting portion 60 is consistent with an extending direction of the second limiting portion 46, and the third limiting portion 60 extends out of the first positioning hole 24. In an embodiment, an end of the second limiting portion 46 is bent away from the hook 33 (shown in FIGS. 3-4). In another embodiment, the end of the second limiting portion 46 is bent immediately adjacent to the hook 33 (shown in FIG. 5). In another embodiment, the end of the second limiting portion 46 is not bent (shown in FIGS. 6-7). The first limiting portion 44 extends vertically from the base plate 66. The second limiting portion 46 extends parallel to the base plate 66 from an end of the first limiting portion 44 away from the base plate 66.

Figure 4:
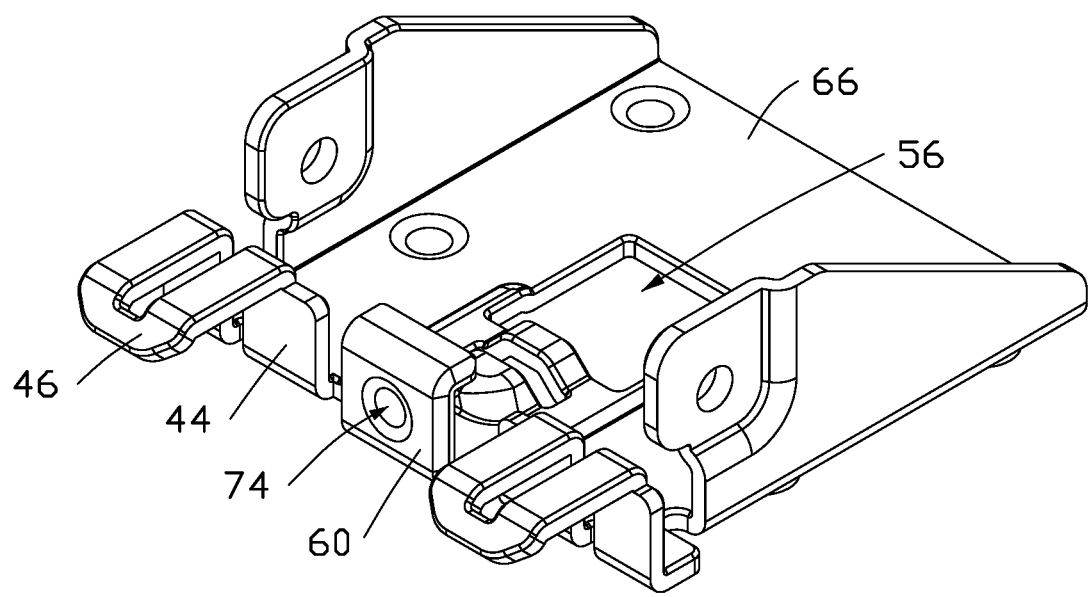
FIG. 4 is an isometric view of a connecting member of the sliding rail structure of FIG. 3, according to another embodiment.
Figure 5:
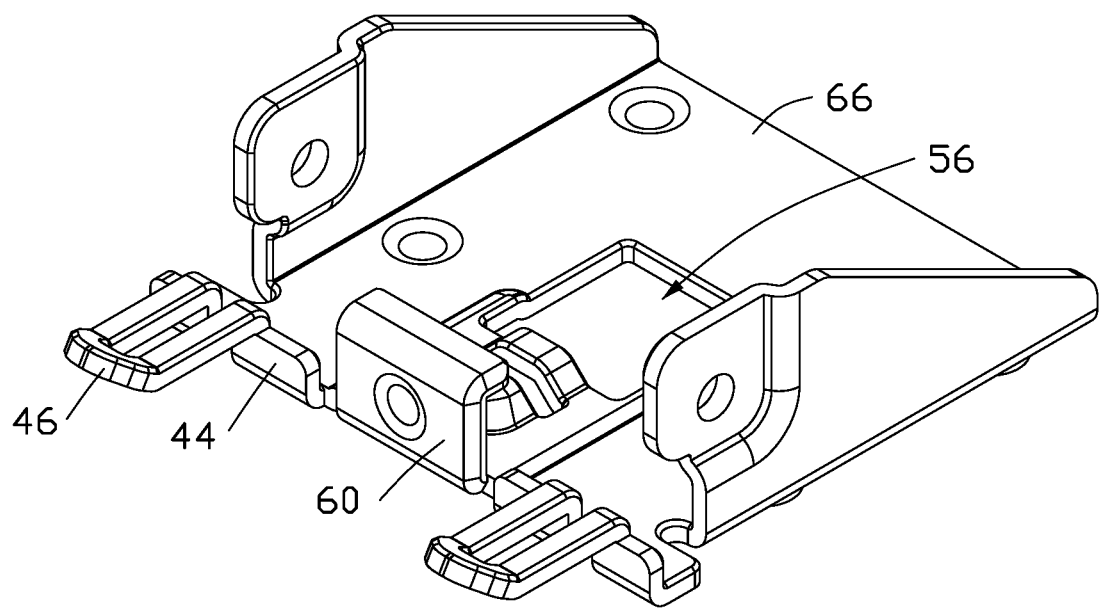
FIG. 5 is an isometric view of a connecting member according to another embodiment.

Referring to FIG. 4, in another embodiment, the third limiting portion 60 perpendicularly extends from the base plate 66. The third limiting portion 60 defines a second positioning hole 74. The second positioning hole 74 is aligned with the first positioning hole 24 to further restrict the movement of the rail member 42 relative to the fixing plate 20, through a positioning member fixed in the first positioning hole 24 and the second positioning hole 74.

Figure 6:
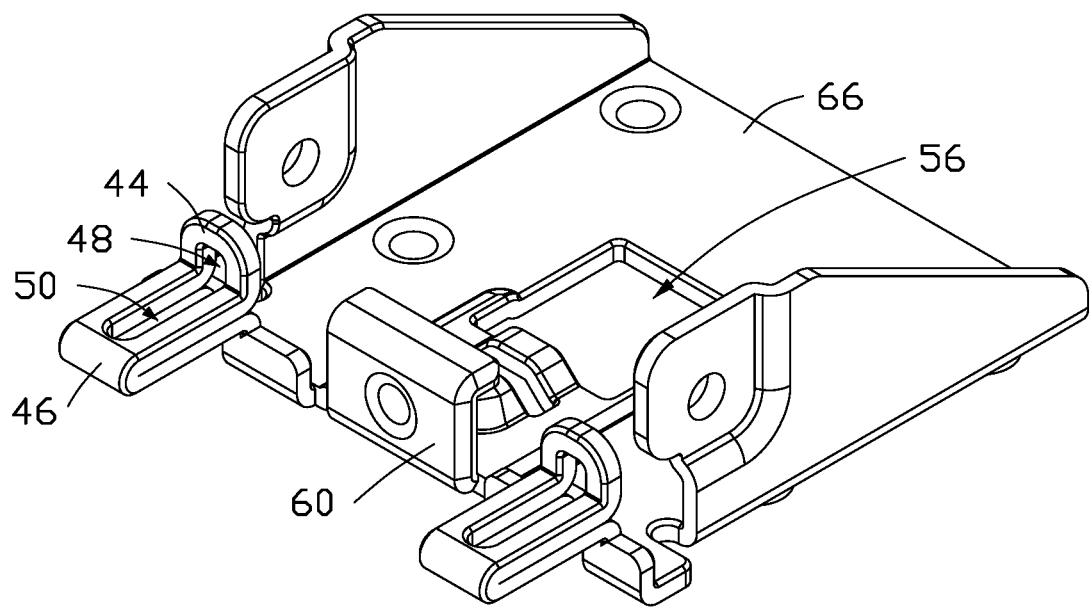
FIG. 6 is an isometric view of a connecting member according to another embodiment.
Figure 7:
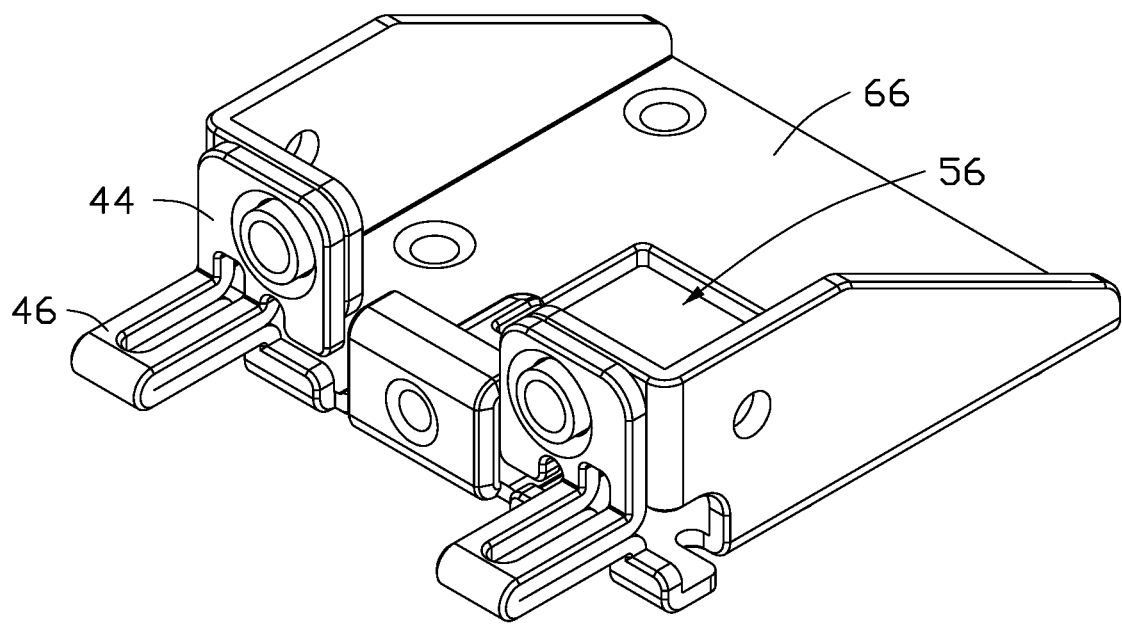
FIG. 7 is an isometric view of a connecting member according to another embodiment.

Referring to FIGS. 6-7, in another embodiment, the first limiting portion 44 extends vertically from the base plate 66. The second limiting portion 46 extends parallel to the base plate 66 from an end of the first limiting portion 44 adjacent to the base plate 66. In FIG. 6, a width of the first limiting portion 44 is the same as a width of the second limiting portion 46. In FIG. 7, the width of the first limiting portion 44 is greater than the width of the second limiting portion 46.

Figure 8:
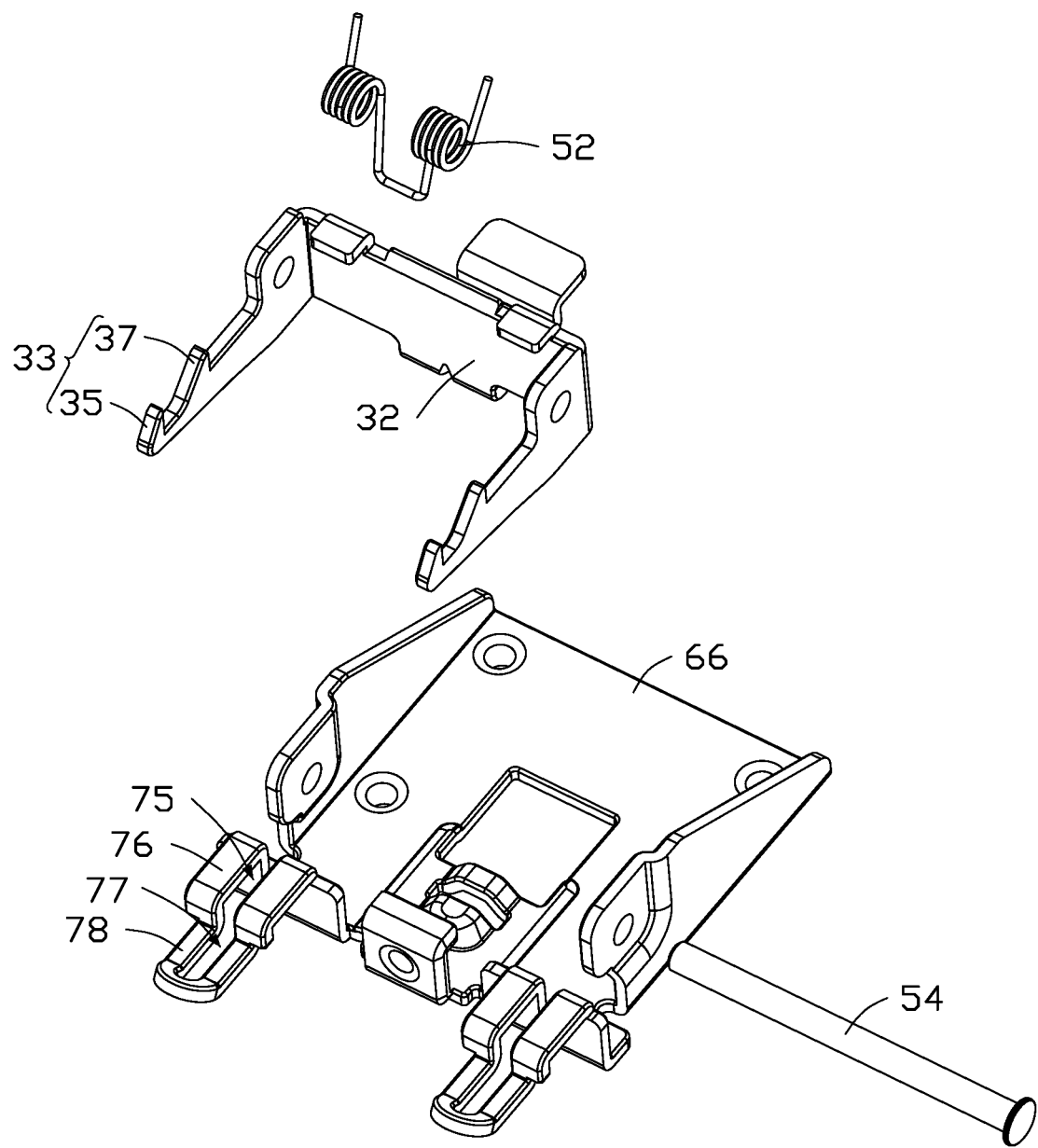
FIG. 8 is an isometric view of a connecting member according to another embodiment.

Referring to FIG. 8, the second limiting portion 46 includes a base portion 76 and an extension portion 78 between the base portion 76 and the base plate 66. The base portion 76 forms a first hole 75 and the extension portion 78 forms a second hole 77. The hook 33 includes a first hook 37 and a second hook 35. The first hook 37 is farther than the second hook 35 from the base plate 66. The first hook 37 is positioned in the first hole 75, and the second hook 35 is positioned in the second hole 77. In this way, the first hook 37 or the second hook 35 can be selected to resist the fixing plate 20 according to the position of the edge of the restriction hole 22.

Figure 9:
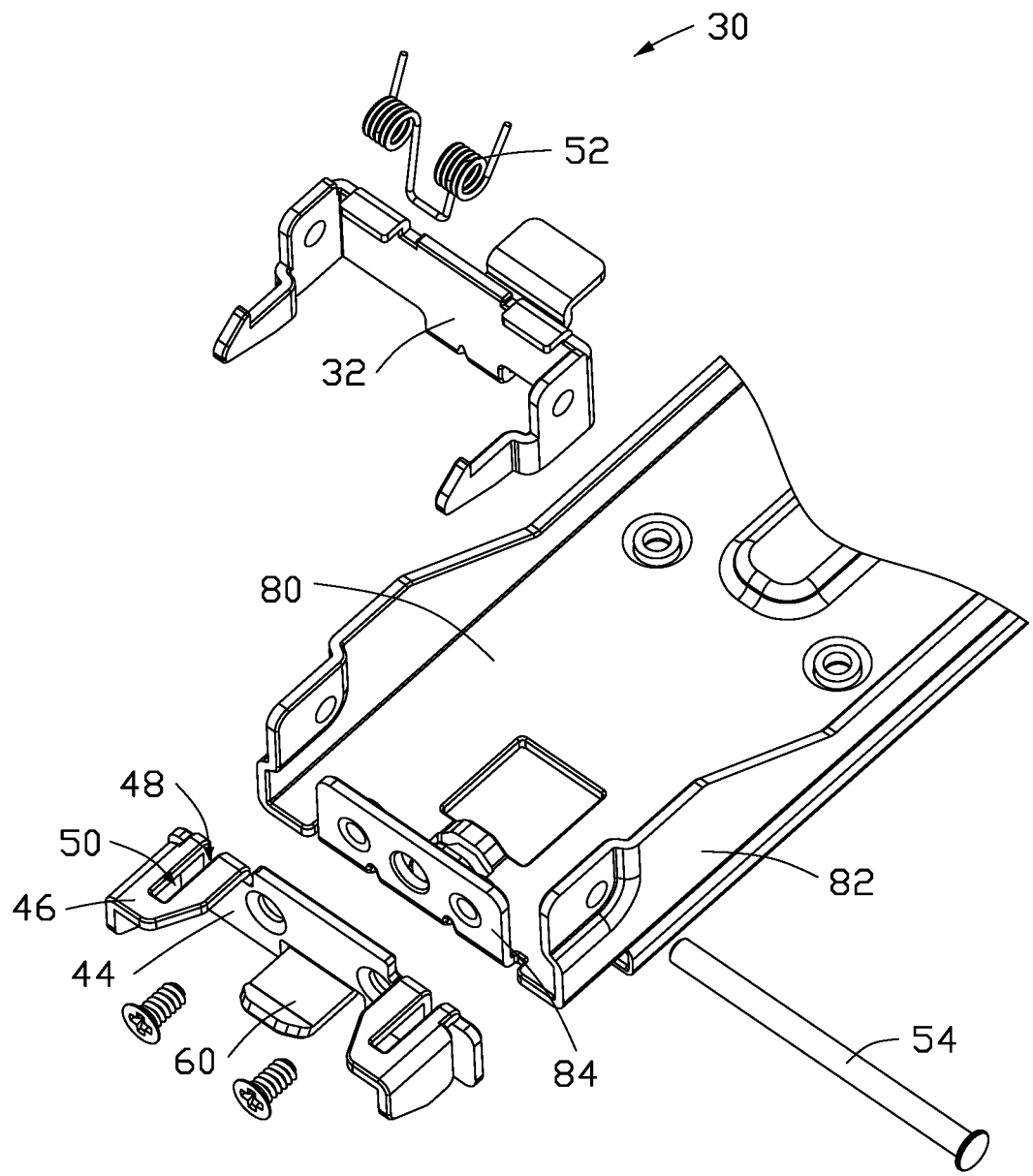
FIG. 9 is an exploded isometric view of another sliding rail structure, according to another embodiment.

Referring to FIG. 9, in another embodiment, the through hole 56, the accommodating groove 58 are formed on the sliding rail 62. The rotating shaft 54 is connected to the sliding rail 62 and the buckle 32. The sliding rail 62 includes a sliding plate 80, two limiting pieces 82 perpendicular to two edges of the sliding plate 80, and a fixing member 84 between the two limiting pieces 82. The buckle 32 is connected between the two limiting pieces 82. The fixing member 84 is perpendicular to the sliding plate 80, and the connecting member 64 is fixed on the fixing member 84. The fixing member 84 and the connecting member 64 can be connected by a screw hole and a screw. The connecting member 64 includes the base plate 66 perpendicular to the extending direction of the sliding rail 62, and the first limiting portion 44 and the second limiting portion 46 are both fixed on the base plate 66. The first limiting portion 44 and the second limiting portion 46 can be same as shown in FIGS. 3-8.

Figure 10:
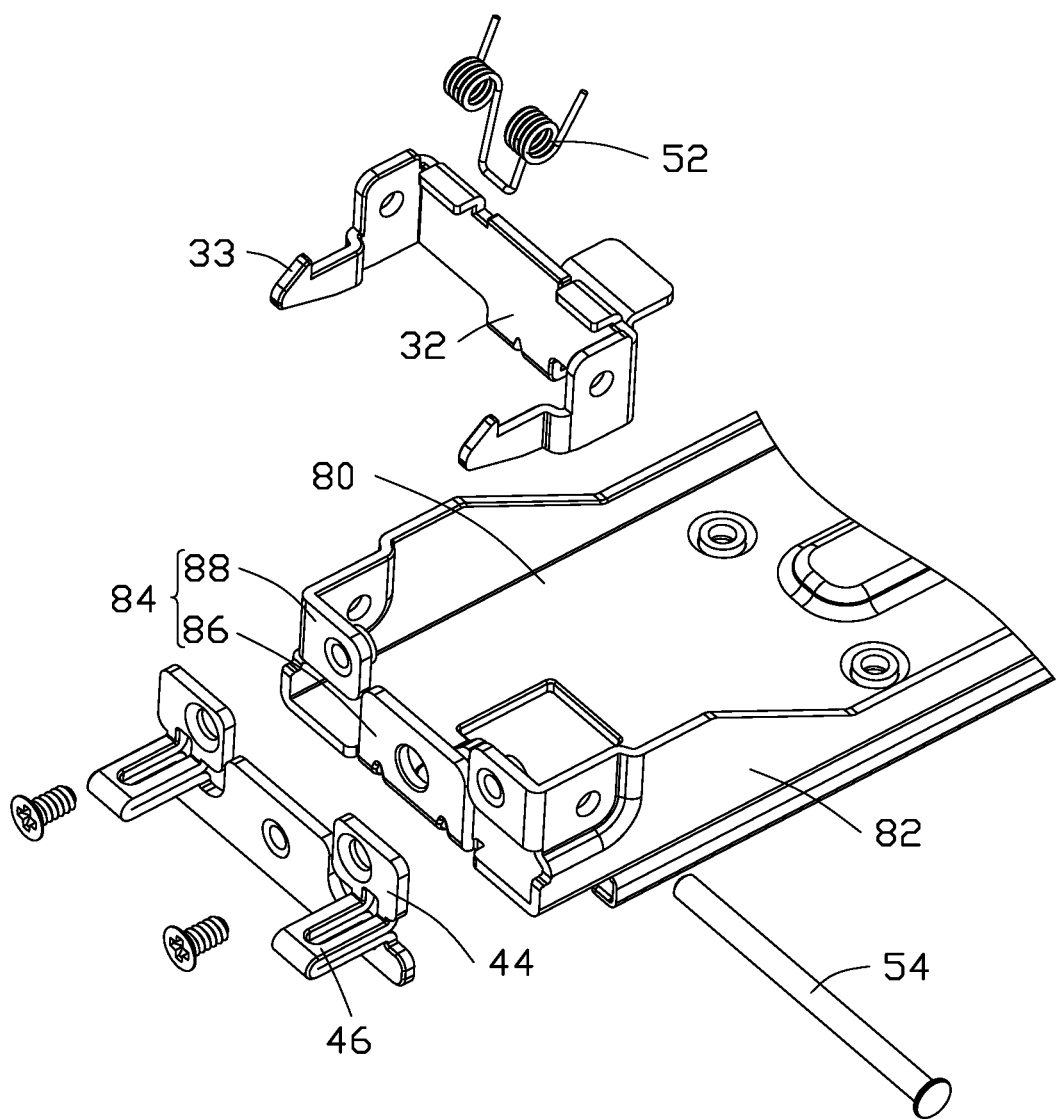
FIG. 10 is an exploded isometric view of another sliding rail structure, according to another embodiment.

Referring to FIG. 10, the fixing member 84 includes a first fixing portion 86 protruding from the sliding plate 80 and two second fixing portions 88 extending toward each other from the two limiting pieces 82. The two second fixing portions 88 are spaced from the sliding plate 80. The connecting member 64 is connected to the first fixing portion 86 and the two second fixing portions 88.

When installing the fixing plate 20, the hook 33 of the sliding rail structure 30 passes through the restriction hole 22 to resist the fixing plate 20. When removing the fixing plate 20, the buckle 32 of the sliding rail structure 30 is rotated to disengage the hook 33 from the fixing plate 20 and move the fixing plate 20 or the sliding rail structure 30 along the axial direction of the restriction hole 22. Thus, installing and removing the fixing plate 20 can be achieved without tools, which is convenient.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A sliding rail structure comprising:
   a rail assembly comprising a rail member, the rail member comprising at least one first limiting portion and at least one second limiting portion, each of the at least one first limiting portion defining a first limiting hole, and each of the at least one second limiting portion defining a second limiting hole communicating with the corresponding first limiting hole; and a buckle rotatably connected to the rail assembly and comprising at least one hook, each of the at least one hook passing through the first limiting hole to be positioned the second limiting hole, the hook being rotatable in the corresponding second limiting hole when the buckle rotates wherein the rail assembly further comprises an elastic member and a rotating shaft, the rotating shaft is fixed to the rail member, the elastic member is sleeved on the rotating shaft and resists the rail member and the buckle.

2. The sliding rail structure of claim 1, wherein the rail member further defines an accommodating groove, the elastic member is partially positioned in the accommodating groove and resists the rail member, the buckle defines two locking slots, two ends of the elastic member are placed in the two locking slots and resist the buckle.

3. The sliding rail structure of claim 1, wherein the rail member defines a through hole, the buckle comprises a pressing portion, one end of the pressing portion abuts a side of the rail member adjacent to the hook, the pressing portion is partially positioned in the through hole.

4. The sliding rail structure of claim 3, wherein the rail member comprises a sliding rail and a connecting member fixed to an end of the sliding rail, the connecting member comprises a base plate parallel to an extending direction of the sliding rail and two spaced fixing pieces protruding on the base plate, the through hole is defined on the base plate.

5. The sliding rail structure of claim 4, wherein the second limiting portion comprises a base portion and an extension portion, the base portion defines a first hole and the extension portion defines a second hole, the hook comprises a first hook and a second hook, the first hook is farther from the base plate than the second hook, the first hook is positioned in the first hole, and the second hook is positioned in the second hole.

6. The sliding rail structure of claim 3, wherein the rail member comprises a sliding rail and a connecting member fixed to an end of the sliding rail, the connecting member comprises a base plate perpendicular to an extending direction of the sliding rail, and the first limiting portion and the second limiting portion both fixed on the base plate, the through hole is defined on the sliding rail.

7. The sliding rail structure of claim 6, wherein the sliding rail comprises a sliding plate, two limiting pieces perpendicular to two edges of the sliding plate, and a fixing member between the two limiting pieces, the buckle is connected between the two limiting pieces, the connecting member is fixed on the fixing member.

8. The sliding rail structure of claim 7, wherein the fixing member comprises a first fixing portion protruding from the sliding plate and two second fixing portions extending from the two limiting pieces toward each other, the two second fixing portions are spaced from the sliding plate, the connecting member is connected to the first fixing portion and the two second fixing portions.

9. The sliding rail structure of claim 1, wherein the rail member comprises two first limiting portions and two second limiting portions, the buckle comprises two hooks, the rail member further comprises a third limiting portion disposed between the two second limiting portions.

10. A server cabinet comprising:

a fixing plate defining at least one restriction hole;

a rail assembly comprising a rail member, the rail member comprising at least one first limiting portion and at least one second limiting portion, each of the at least one second limiting portion passing through one of the at least one restriction hole and being disposed on a first side of the fixing plate, the at least one first limiting portion being disposed on a second side of the fixing plate opposite to the first side, each of the at least one first limiting portion defining a first limiting hole, and each of the at least one second limiting portion defining a second limiting hole communicating with the corresponding first limiting hole; and a buckle rotatably connected to the rail assembly and comprising at least one hook, each of the at least one hook passing through one of the first limiting hole to abut the first side and disengaging from the first side when the buckle rotates a preset angle.

11. The server cabinet of claim 10, wherein the rail assembly further comprises an elastic member and a rotating shaft, the rotating shaft is fixed to the rail member, the elastic member is sleeved on the rotating shaft and resists the rail member and the buckle.

12. The server cabinet of claim 11, wherein the rail member further defines an accommodating groove, the elastic member is partially positioned in the accommodating groove and resists the rail member, the buckle defines two locking slots, two ends of the elastic member are placed in the two locking slots and resist the buckle.

13. The server cabinet of claim 10, wherein the rail member defines a through hole, the buckle comprises a pressing portion, one end of the pressing portion abuts a side of the rail member adjacent to the hook, the pressing portion is partially positioned in the through hole.

14. The server cabinet of claim 13, wherein the rail member comprises a sliding rail and a connecting member fixed to an end of the sliding rail, the connecting member comprises a base plate parallel to an extending direction of the sliding rail and two spaced fixing pieces protruding on the base plate, the through hole is defined on the base plate.

15. The server cabinet of claim 14, wherein the second limiting portion comprises a base portion and an extension portion, the base portion defines a first hole and the extension portion defines a second hole, the hook comprises a first hook and a second hook, the first hook is farther from the base plate than the second hook, the first hook is positioned in the first hole, and the second hook is positioned in the second hole.

16. The server cabinet of claim 13, wherein the rail member comprises a sliding rail and a connecting member fixed to an end of the sliding rail, the connecting member comprises a base plate perpendicular to an extending direction of the sliding rail, and the first limiting portion and the second limiting portion both fixed on the base plate, the through hole is defined on the sliding rail.

17. The server cabinet of claim 16, wherein the sliding rail comprise s a sliding plate, two limiting pieces perpendicular to two edges of the sliding plate, and a fixing member between the two limiting pieces, the buckle is connected between the two limiting pieces, the connecting member is fixed on the fixing member.

18. The server cabinet of claim 17, wherein the fixing member comprises a first fixing portion protruding from the sliding plate and two second fixing portions extending from the two limiting pieces toward each other, the two second fixing portions are spaced from the sliding plate, the connecting member is connected to the first fixing portion and the two second fixing portions.

19. The server cabinet of claim 10, wherein the rail member comprises two first limiting portions and two second limiting portions, the buckle comprises two hooks, the rail member further comprises a third limiting portion disposed between the two second limiting portions, the third limiting portion is connected to the fixing plate.

* * * * *